United States Patent
Hoffmann et al.

(10) Patent No.: US 6,198,199 B1
(45) Date of Patent: Mar. 6, 2001

(54) METHOD FOR DIAGNOSING A SHORT CIRCUIT AT A CAPACITIVE ACTUATOR

(75) Inventors: Christian Hoffmann, Regensburg; Hellmut Freudenberg, Grossberg; Hartmut Gerken, Nittendorf; Martin Hecker, Laimerstadt; Richard Pirkl, Regensburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/391,719

(22) Filed: Sep. 8, 1999

(30) Foreign Application Priority Data

Sep. 8, 1998 (DE) .............................................. 198 41 002

(51) Int. Cl.⁷ .............................. G01R 22/00; H02N 2/00

(52) U.S. Cl. ...................................... 310/316.03; 310/317

(58) Field of Search ..................... 310/316.02, 316.03, 310/317

(56) References Cited

U.S. PATENT DOCUMENTS 4,688,536 * 8/1987 Mitsuyasu et al. .................. 310/317
6,016,040 * 1/2000 Hoffmann et al. ................... 310/317

FOREIGN PATENT DOCUMENTS

19652801C1   4/1998   (DE) ............................... H02N/2/00

* cited by examiner

Primary Examiner—Thomas M. Dougherty
(74) Attorney, Agent, or Firm—Herbert L. Lerner; Laurence A. Greenberg; Werner H. Stemer

(57) ABSTRACT

A short circuit between a negative pole GND and a capacitive actuator in a circuit with a charging capacitor, a recharging capacitor, a recharging coil and a selector switch is determined by calculating a value corresponding to the quantity of charge QL flowing off from the recharging capacitor during a charging operation. The quantity of charge is compared with an integral of current i flowing during the charging operation via the selector switch assigned to the actuator. A short circuit of the actuator to the negative pole is diagnosed when the integral is smaller than $k*QL$ ($k<1$).

7 Claims, 1 Drawing Sheet

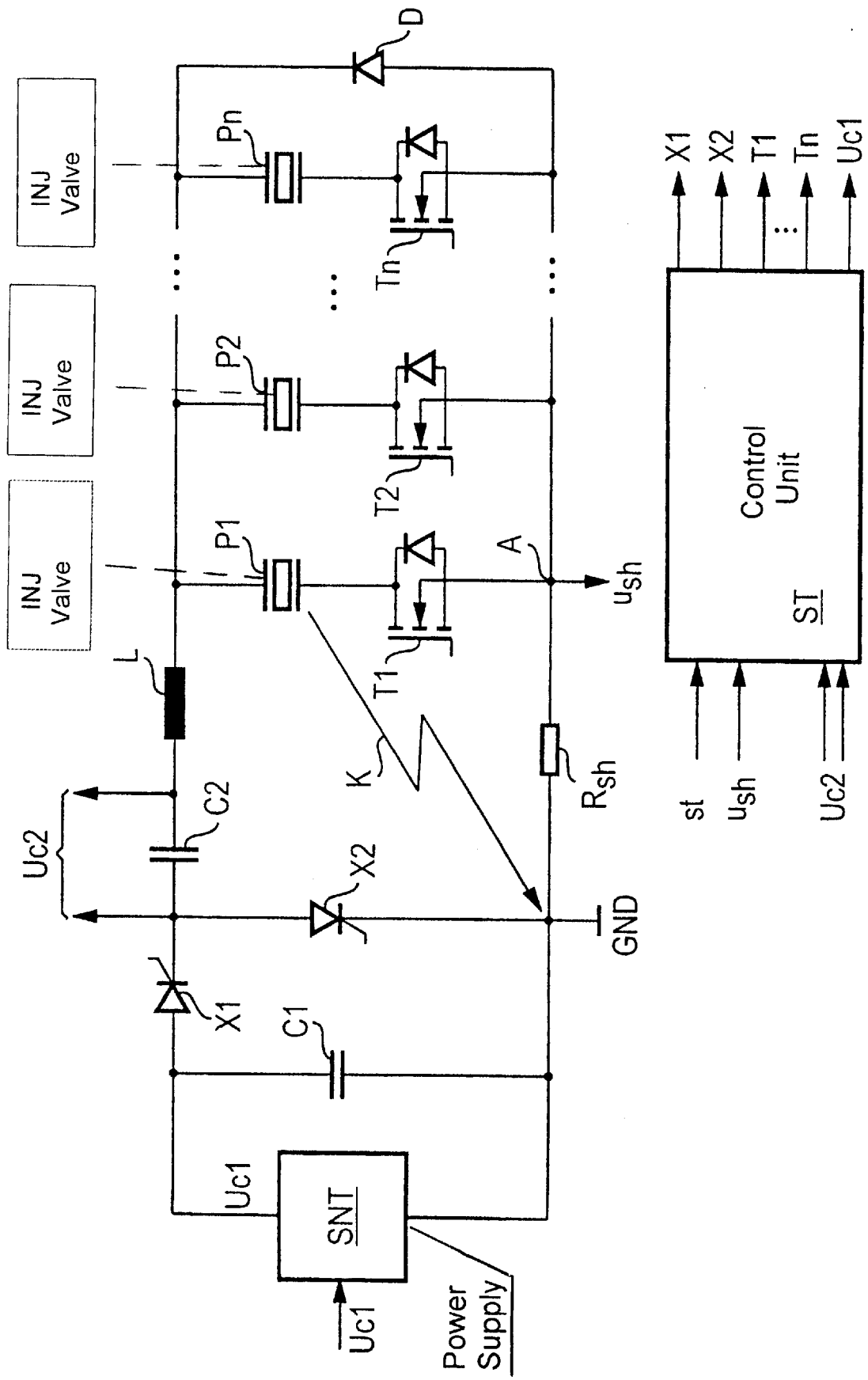

US 6,198,199 B1

METHOD FOR DIAGNOSING A SHORT CIRCUIT AT A CAPACITIVE ACTUATOR

BACKGROUND OF THE INVENTION

1. Field of the Invention

The invention relates to a method for diagnosing a short circuit of a capacitive actuator, in particular a piezoelectrically operated fuel injection valve of an internal combustion engine of a motor vehicle.

German Patent DE 196 52 801 C1 discloses a device for driving capacitive actuators, by which the actuators, of which each is connected in series with a selector switch constructed as a low-side switch, are charged one after another from the series circuit of a charging capacitor and a recharging capacitor.

It has emerged from the operation of such circuits that shorts of the negative—but also of the positive—actuator terminal to the frame can occur with such actuators. This fault (if not all actuators are short circuited in the case of a short circuit of a positive actuator terminal) has the effect that as every other actuator is driven the actuator short circuited to the frame is also always driven. These two actuators act relative to the drive circuit like one actuator with double the capacitance.

However, since the capacitance of an actuator can likewise vary by a factor of 2 in the permissible temperature range, this fault cannot be detected with the aid of simple voltage monitoring.

SUMMARY OF THE INVENTION

It is accordingly an object of the invention to provide a method for diagnosing a short circuit at a capacitive actuator which overcomes the above-mentioned disadvantages of the prior art methods of this general type, by which it is possible unambiguously to diagnose a short circuit of the actuator to the frame.

With the foregoing and other objects in view there is provided, in accordance with the invention, a method for diagnosing in a drive circuit having a capacitive actuator and voltage source with a positive pole and a negative pole a short circuit between the negative pole and the capacitive actuator, the drive circuit including a low-side selector switch connected in series with the capacitive actuator and a first series circuit formed of a charging capacitor and a recharging capacitor for charging the capacitive actuator, the charging capacitor disposed between the positive pole and the negative pole of the voltage source, the drive circuit further having a second series circuit formed of a charging switch, the recharging capacitor, a recharging coil, the capacitive actuator and the selector switch connected in parallel with the charging capacitor, the method which includes:

calculating a charge value corresponding to a quantity of charge $Q_L$ flowing off from the recharging capacitor during a charging operation;

comparing the charge value with a value $\int i dt$ calculated from a current $i$ flowing during the charging operation via the selector switch connected to the capacitive actuator; and diagnosing the short circuit of the capacitive actuator to the negative pole if $\int i dt < k^* Q_L$ where $k<1$.

Other features which are considered as characteristic for the invention are set forth in the appended claims.

Although the invention is illustrated and described herein as embodied in a method for diagnosing a short circuit at a capacitive actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a diagrammatic, circuit diagram of an actuator drive circuit for explaning a diagnostic method according to the invention.

DESCRIPTION OF THE PREFERRED EMBODIMENTS

Referring now to the single FIGURE of the drawing known from German Patent DE 196 52 801 C1 and used to explain the method of the instant application, there is shown an actuator P1, for driving a piezoelectrically actuated fuel injection valve INJ of an internal combustion engine of a motor vehicle. The method is to be applied in the same way for all other actuators P2 to Pn.

In the known circuit, there is connected between a positive pole Uc1 and a negative pole GND of a switched-mode power supply SNT, a charging capacitor C1 which is charged to an output voltage Uc1 of the switched-mode power supply SNT. Disposed in parallel with the charging capacitor C1 is a series circuit of a charging switch X1, connected to the positive pole Uc1, and a discharging switch X2, connected to the negative pole or frame terminal GND.

Connected between a tie (nodal) point of the charging switch X1 and the discharging switch X2 and the frame terminal GND is a series circuit of a recharging capacitor C2, a recharging coil L, a first actuator P1 and a first selector switch T1.

For each further actuator, a series circuit of the actuator P2 to Pn and a further selector switch T2 to Tn is connected in parallel with the series circuit of the first actuator P1 and the first selector switch T1. A diode D which passes current away from the frame terminal GND towards the coil L is disposed in parallel with the series circuits of the actuator and the selector switch.

The switches X1 and X2 are constructed in this exemplary embodiment as thyristors, and the selector switches T1–Tn are constructed as controlled power MOSFET switches. Power MOSFET switches usually include inverse diodes.

The switches X1, X2 and T1 to Tn are controlled by a control circuit ST, which is part of a microprocessor-controlled engine control unit (not represented further), in accordance with a program which is explained in more detail in German Patent DE 196 52 801 C1 and is described below only to the extent necessary to understand the invention.

In this known circuit, a shunt resistor $R_{Sh}$ is inserted between a tie point A of all the selector switches T1 to Tn and the negative pole GND, and a voltage $u_{Sh}$ which can be measured at this tie point is fed to the microprocessor-controlled control circuit ST, in which computing and comparing operations described below are carried out.

All references below are to the actuator P1. The actuator P1 is charged by closing the switches X1 and T1. As a result, the charging voltage Uc=Uc1+Uc2 present on the series circuit of C1+C2 is discharged during a complete sinusoidal half-oscillation via the coil L into the actuator P1, and the latter opens the non-illustrated injection valve assigned to it.

In the case of fault-free operation, a current i flows from C1 back to C1 via X1, C2, L, P1, T1 and $R_{Sh}$ via GND.

During the charging operation of the actuator P1, the recharging capacitor C2 is recharged to a negative voltage via the recharging coil L. A difference $\Delta U_{C2}$ between the voltages before a start ($U_{C2a}$) and after an end ($U_{C2b}$) of the charging operation is a measure of the quantity of charge $Q_L$ (Q=C*U) transferred to the actuator P1, as is also the current i flowing during the charging operation via the actuator P1 and thus via the selector switch T1 and the shunt resistor $R_{Sh}$, or else the voltage $u_L$ dropping across the recharging coil L during the charging operation:

$$\Delta U_{C2} = U_{C2a} - U_{C2b}; \quad Q_L \sim \Delta U_{C2} \sim \int i \, dt \sim \int u_L dt \quad (1)$$

Since the current i is usually to be measured not directly, but more simply via the voltage $u_{Sh}$ which is proportional to the current and drops across the shunt resistor $R_{Sh}$, is fed to the control circuit ST, it follows that:

$$Q_L = C2^* \Delta U_{C2} = \frac{1}{R_{sh}} \int u_{sh} dt \quad (2)$$

After decay of the current, the charging switch X1, constructed here as a thyristor, ceases to conduct (opens) automatically, the selector switch T1 is closed and the actuator P1 remains charged until the discharging switch X2, and thus the injection valve are closed again.

If a short circuit of the negative terminal of the actuator P1 to the negative pole GND occurs—represented in the drawing as a lighting flash K—during the charging operation a specific quantity of charge flows to the frame terminal GND from the recharging capacitor C2 via the recharging coil L and the actuator P1, but not via the selector switch T1 and the shunt resistor $R_{Sh}$, that is to say a short-circuit current $i_K$ flows from C1 via X1, C2, L and then via P1, or directly via GND back to C1, past the selector switch T1 and the shunt resistor $R_{Sh}$. The voltage difference $\Delta U_{C2} = U_{C2a} - U_{C2b}$, which can now be measured across the recharging capacitor C2, or the integral of the coil voltage $u_L$ is no longer equal to the current flowing through the shunt resistor $R_{Sh}$, but greater, since the current $i_K$ takes a direct path to the negative pole or frame terminal GND. Consequently, in the case of a short circuit, no voltage $u_{Sh}$, or only a very slight one, will be capable of measurement across the shunt resistor $R_{Sh}$, with the result that $$C2^* \Delta U_{C2} = \frac{1}{L} \int u_L dt \neq \frac{1}{R_{sh}} \int u_{sh} dt, \quad (3)$$

$$\text{i.e. } C2^* U_{C2} > \frac{1}{R_{sh}} \int u_{sh} dt$$

Thus, the following steps are taken in the control circuit ST in which the values C2 (or L) and $R_{Sh}$ are stored in order to diagnose a short circuit at a capacitive actuator by use of the capacitor voltage $U_{C2}$ or the coil voltage $u_L$:

a) the voltage, fed to the control circuit ST, before ($U_{C2a}$) and after ($U_{C2b}$) the charging operation is measured, and the product k*C2*$\Delta U_{C2}$ or $$\frac{1}{L} \int u_L dt$$

is calculated from the voltage difference $\Delta U_{C2} = U_{C2a} - U_{C2b}$, the stored value C2 and a factor k (k<1, preferably k=0.9), b) the integral $$\frac{1}{R_{Sh}} \int u_{Sh} dt$$

is calculated from the voltage $u_{Sh}$, which is fed to the control circuit ST during a charging operation and is proportional to the current i, and the stored resistor value for $R_{Sh}$, and c) the product k*C2*$\Delta U_{C2}$ or the integral $$\frac{1}{L} \int u_L dt$$

is compared with the integral $$\frac{1}{R_{Sh}} \int u_{Sh} dt.$$

If k*C2*$\Delta U_{C2}$ or $$k^* \frac{1}{L} \int u_L dt > \frac{1}{R_{Sh}} \int u_{Sh} dt,$$

it is deduced therefrom that the actuator P1 just charged, here P1, is fault-free, that is to say has no short circuit to the negative pole GND, since in this case $$C2^* \Delta U_{C2} = \frac{1}{L} \int u_L dt \sim \frac{1}{R_{Sh}} \int u_{Sh} dt.$$

If, however, it is determined that $$\frac{1}{R_{Sh}} \int u_{Sh} dt < k^* C2^* \Delta U_{C2}$$

or $$\frac{1}{L} \int u_L dt$$

this is evaluated as a short circuit of the actuator just charged, and suitable measures (display of a short circuit and/or switching off the entire device) can then be taken.

A) If another actuator Pn is driven (charged) while the actuator P1 has a short circuit of the negative terminal, the recharging capacitor C2 is discharged into two parallel-connected actuators P1, Pn; the difference $\Delta U_{C2} = U_{C2a} - U_{C2b}$, will in this case be substantially larger than if only one actuator alone were to be driven, since the two actuators act like one actuator with twice the capacitance. The current i flows through the other driven actuator Pn, and a short-circuit current $i_K$ flows through P1, whereas only the current i of the other actuator Pn flows through the shunt resistor $R_{Sh}$.

B) In the case of a short circuit at the positive terminal of one actuator, all the actuators are short circuited and no current flows via the shunt resistor $R_{Sh}$, with the result that in these two named cases, as well, it will hold that A) $\frac{1}{R_{Sh}} \int u_{Sh} dt < k^* C2^* \Delta U_{C2} \left( \text{or } \frac{1}{L} \int u_L dt \right)$ and;

B) $\frac{1}{R_{Sh}} \int u_{Sh} dt \ll k^* C2^* \Delta U_{C2} \left( \text{or } \frac{1}{L} \int u_L dt \right)$, and the short circuit can be reliably detected.

We claim:

1. A method for diagnosing in a drive circuit having a capacitive actuator and voltage source with a positive pole and a negative pole a short circuit between the negative pole and the capacitive actuator, the drive circuit including a low-side selector switch connected in series with the capacitive actuator and a first series circuit formed of a charging capacitor and a recharging capacitor for charging the capacitive actuator, the charging capacitor disposed between the positive pole and the negative pole of the voltage source, the drive circuit further having a second series circuit formed of a charging switch, the recharging capacitor, a recharging coil, the capacitive actuator and the selector switch connected in parallel with the charging capacitor, the method which comprises:

calculating a charge value corresponding to a quantity of charge QL flowing off from the recharging capacitor during a charging operation;

comparing the charge value with a value $\int i dt$ calculated from a current i flowing during the charging operation via the selector switch connected to the capacitive actuator; and diagnosing the short circuit of the capacitive actuator to the negative pole if $\int i dt < k^* Q_L$ where k<1.

2. The method according to claim 1, which comprises calculating the quantity of charge $Q_L = C2^* \Delta U_{C2}$ from a capacitance C2 of the recharging capacitor and a difference $\Delta U_{C2}$ between voltages $Uc_{2a}$ and $Uc_{2b}$ present at the recharging capacitor before $Uc_{2a}$ and after $Uc_{2b}$ the charging operation of the capacitive actuator.

3. The method according to claim 1, which comprises calculating the quantity of charge $$Q_L = \frac{1}{L} \int u_L dt$$

from an inductance L of the recharging coil and a voltage $u_L$ dropping across the recharging coil during the charging operation.

4. The method according to claim 1, which comprises calculating the value $$\int i dt = \frac{1}{R_{Sh}} \int u_{Sh} dt$$

from a voltage $u_{Sh}$ which is proportional to the current i and drops across a shunt resistor connected in series with the selector switch, and from a resistance value $R_{Sh}$ of the shunt resistor.

5. The method according to claim 1, which comprises diagnosing the short circuit of the capacitive actuator to the negative pole if $$\frac{1}{R_{Sh}} \int u_{Sh} dt < k^* C2^* \Delta U_{C2}.$$

6. The method according to claim 1, which comprises diagnosing the short circuit of the capacitive actuator to the negative pole if $$\frac{1}{R_{Sh}} \int u_{Sh} dt < \frac{1}{L} \int u_L dt.$$

7. The method according to claim 1, which comprises using the capacitive actuator for driving a piezoelectrically operated fuel injection valve of an internal combustion engine of a motor vehicle.

* * * * *